United States Patent [19]

Machanian

[11] 4,016,495

[45] Apr. 5, 1977

[54] ELECTRONIC MUSICAL INSTRUMENT USING PLURAL PROGRAMMABLE DIVIDER CIRCUITS

[75] Inventor: William V. Machanian, Lewiston, N.Y.

[73] Assignee: The Wurlitzer Company, Chicago, Ill.

[22] Filed: July 10, 1975

[21] Appl. No.: 594,743

Related U.S. Application Data

[62] Division of Ser. No. 475,449, June 3, 1974, abandoned.

[52] U.S. Cl. .................................. 328/18; 328/14; 328/16; 328/48; 84/1.19

[51] Int. Cl.² ...................... H03K 3/84; G10H 5/00

[58] Field of Search .................. 328/14, 48, 41, 39, 328/37, 16, 18; 84/1.19

[56] References Cited

UNITED STATES PATENTS

| | | | |
|---|---|---|---|
| 3,605,026 | 9/1971 | Bowden | 328/37 X |
| 3,657,658 | 4/1972 | Kubo | 328/48 X |
| 3,818,354 | 6/1974 | Tomisawa et al. | 328/48 X |
| 3,824,379 | 7/1974 | Tomisawa et al. | 328/48 X |

*Primary Examiner*—John S. Heyman
*Attorney, Agent, or Firm*—Olson, Trexler, Wolters, Bushnell & Fosse, Ltd.

[57] ABSTRACT

The embodiment of the invention disclosed herein is directed to an electronic musical instrument of the keyboard type wherein the audio frequency signal information is derived from a multi-frequency generator formed by an electronic oscillator and a plurality of divider circuits, and wherein programmable divider circuits are associated with the various keys of the keyboard to generate associated tone signal information. The programmable divider circuits are formed on a large scale integrated circuit chip and enable alteration of the numerical divisor so that different tone signals can be obtained from the same electronic circuitry thereby enabling the same type of LSI chip to be used for many different circuit configurations. The LSI chip also provides a scanning circuit that scans an X—Y matrix switching arrangement to determine which one of a plurality of key switches is closed. The integrated circuit unit has a pluraity of such programmable divisors arranged to be operated from the same frequency, preferably there being four programmable divisors to obtain a multitude of output audio signal frequencies. Actuation of a key switch, chord button switch, or foot pedal will enable gate circuit components to cause a signal transfer from a matrix array to a read-only-memory circuit, which, in turn, enables selected ones of the programmable divisors for developing the desired audio signal frequencies.

6 Claims, 4 Drawing Figures

1 of 4 DE CODER SR
1 of 8 DE CODER SR
SR
CLOCK
SET
RESET
CL
IN
32 BIT S.R.
OUT
ONE SHOT
B+
H
Ro
÷ 512 400 CT DECODER
500KHZ
÷ 10

ELECTRONIC MUSICAL INSTRUMENT USING PLURAL PROGRAMMABLE DIVIDER CIRCUITS

This is a division of application Ser. No. 445,449, filed June 3, 1974, now abandoned.

BACKGROUND OF THE INVENTION

This invention relates generally to electronic musical instruments, and more particularly to electronic organs and the like, wherein a multi-frequency generator is used to generate a plurality of audio frequencies corresponding to the plurality of notes associated with various keys or foot pedals on a musical instrument. The keys or foot pedals are arranged to give either a single note tone or a chord note tone as desired.

Electronic organs have become relatively common in the musical industry and provide means for simulating the sounds produced by larger wind operated pipe organs, and the like. Such electronic organs differ from one another substantially in certain specific respects, such as whether the tone produced from the organ is obtained by a tone generator associated with additive or subtractive circuits. They also differ as to the specific type of generator used to obtain the base frequency, as for example, whether they are transistor or tube oscillators, wind-driven reed elements, rotating tone wheels and the like. However, all of these electronic organs can be distinguished by certain common features. In particular, each organ has a plurality of tone generators, there being one tone generator for each note of the keyboard and foot pedal associated with a two-manual type organ. Furthermore, associated with the least expensive types of electronic organs there is a single tone generator which is to be associated with the plurality of pedal tones, these tones being driven by one or more divider circuits connected to the single tone generator, which divides the frequency from the keyboard to obtain the desired notes. This is accomplished without difficulty because only a single pedal note is played at a time so that only a single generator is needed to produce the various signals.

It will be immediately apparent that there is a rather significant redundancy of tone generators use in prior art types of electronic organs. However, since the maximum number of notes that normally can be played at any one time is twelve, one note for each finger of the two hands and one note for each foot when manipulating the foot pedals, there are a multitude of tone generators that are not in use during this time. In popular organ playing, it is unusual to use more than one pedal tone at a given time and it is to be expected that no more than perhaps five notes will be played at any given time by the fingers of both hands. Some effort has been made to reduce the redundancy of tone generators needed by using tunable oscillators, wherein an oscillator is shared with two or three adjacent notes on the keyboard. This is done under the presumption that only one of these notes will be played at any given time. However, the presumption does not always hold true, and this is at best a low cost approach to developing electronic musical instruments of this type. In any event, there are still more tone generators needed than can be utilized at any one time by a single person playing with both hands and both feet.

The oscillators or other tone generator devices provide an audio frequency oscillation which bears a direct relation to the frequency of the note being played by the particular key on the keyboard or foot pedal. In the case of subtractive organ circuits, the note generated is the fundamental of the note played. In this case a large number of harmonics are provided by the particular generator, and the undesired harmonics are filtered out in accordance with the organ stop which is then being used. On the other hand, in the case of additive organ circuits, the tone generated may be a sub-harmonic of the tone played and the sub-harmonic is then multiplied to achieve the desired audio-frequency output.

All of the electronic organ circuitry heretofore utilized have been of the type which require discrete active and passive components formed in relatively large chassis or secured to large circuit boards or the like. These large circuit boards generally may be of the printed circuit type formed on fiberglass or other non-conductive sheet material. These discrete components may take the form of individual tubes or transistors as well as including a multitude of inductance and capacitance elements which provide the necessary LC circuits for the oscillators. Furthermore, coupling capacitors and voltage developing resistors may be included in the plurality of discrete electronic components. This type of prior art configuration, and any of the above types of organ arrangements, is relatively complex to manufacture, and furthermore, requires a substantial amount of maintenance over the life of the organ. As well as corrective and preventative maintenance, occasional tuning of the oscillator circuits is required to maintain the organ tone qualities in tune.

SUMMARY OF THE INVENTION

Accordingly, it is an object of this invention to provide a new and improved electronic musical instrument circuit arrangement which can have the major portion thereof formed as an integrated circuit component and which is completely free of tuned circuits requiring inductance and capacitance elements such as that used in oscillator circuits.

Another object of this invention is to provide a new and improved electronic musical instrument wherein a plurality of keys are connected in a matrix array configuration and the actuation of any particular key is determined as a result of time-frame sequence of the matrix array to produce an output pulse at a particular point in time of the scanned sequence. This output pulse is then used to energize or gate appropriate tone signal generators.

Still another object of this invention is to provide a new and improved electronic musical instrument wherein a plurality of programmable divisor circuits are energized from a common clock generator, and wherein the programmable divisor can be changed to produce the desired divisor output signal.

Many other objects, features and advantages of this invention will be more fully realized and understood from the following detailed description when taken in conjunction with the accompanying drawings wherein like reference numerals throughout the various views of the drawings are intended to designate similar elements or components.

DETAILED DESCRIPTION OF THE ILLUSTRATED EMBODIMENT

Figure 1:
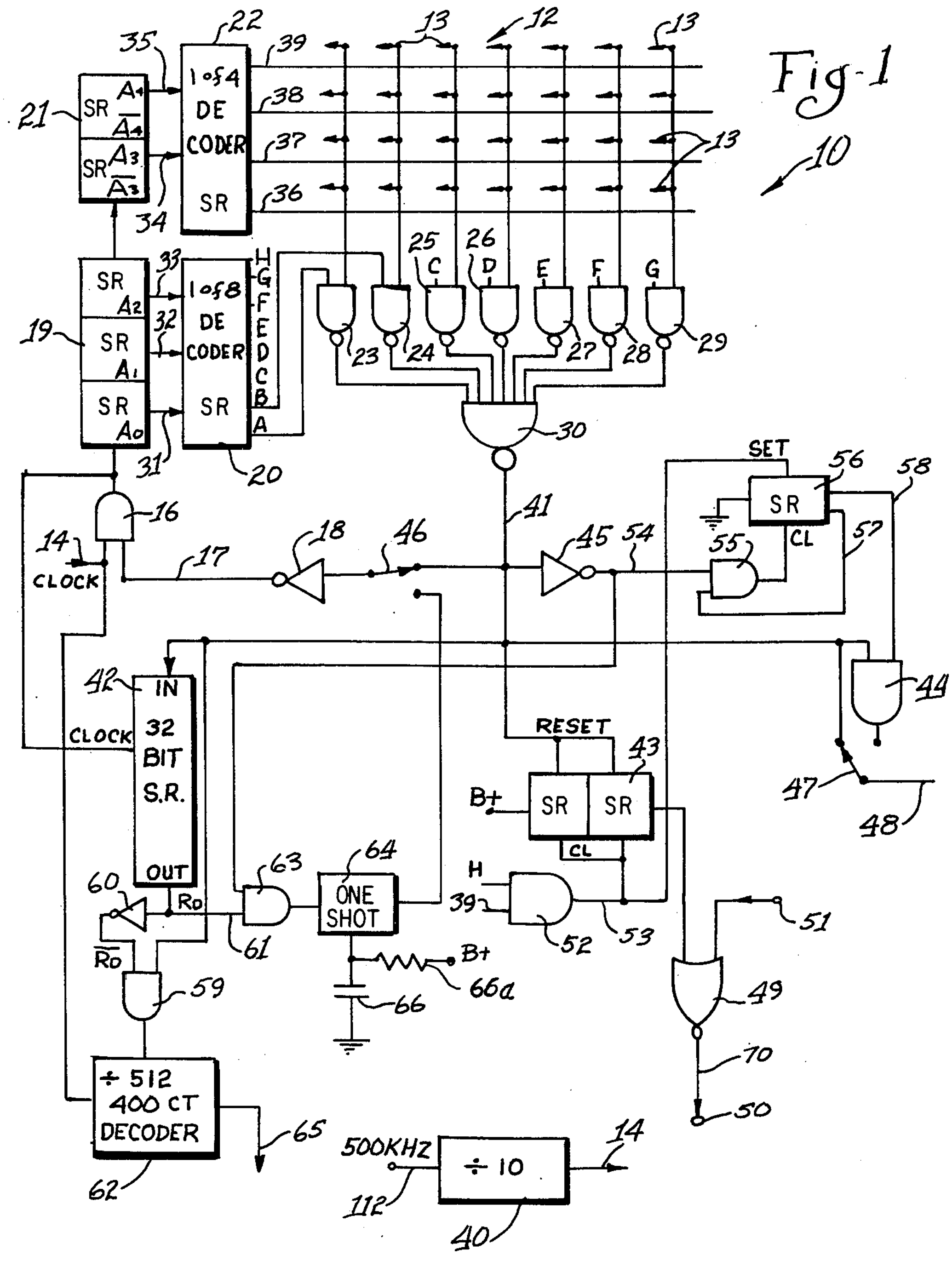
FIG. 1 is a detailed block diagram of a portion of a logic circuit used in accordance with the principles of this invention.

Referring now to FIG. 1 there is seen a schematic logic diagram of an electronic musical instrument circuit configuration constructed in accordance with the principles of this invention and designated generally by reference numeral 10. The entire circuitry illustrated in the drawings is formed on a large scale integrated circuit. The specific embodiment illustrated herein is obtainable from the Wurlitzer Company under part number 141,099. Other large scale integrated circuit chips which can be used in accordance with this invention are obtainable under part numbers 142,168 and 142,169. Here the electronic musical instrument circuit 10 is provided with a matrix array 12 which is formed in an X—Y pattern having a plurality of cross over points, each cross over point corresponding to a particular one of a plurality of keys to be actuated on the musical instrument. Each of the cross over points includes switches 13 associated with the Y or vertical lines and which are to be actuated to short circuit or engage with the X or horizontal lines of the matrix array. Each of the switches 13 may correspond to a selected one of the pedal keys or to one of the chord keys or to one of the synthesizer keyboard keys to be played.

The matrix array 12 is scanned in a time-frame sequencing manner to that each cross over point is interrogated at a particular point in time of a given time-frame sequence. In the illustrated embodiment there are twenty-eight cross over points provided by four horizontal lines and seven vertical lines.

A scanning clock pulse signal is applied to an input line 14, which is one of the inputs of an AND gate 16 to control the scanning sequence of operation of the electronic circuit 10. This scanning clock pulse is 50 KHz and is obtained from a divide-by-ten circuit 40 connected to the main clock oscillator line 112 which operates at 500 KHz. A second input line 17 is coupled to the AND gate 16 via an INVERTER 18 which is used to control or gate the clock pulse "on" or "off". The output of AND gate 16 is delivered to a three-bit counter circuit 19 having the three binary outputs 31, 32 and 33 thereof coupled to a one-of-eight decoder network 20. The third stage of the three-stage divider 19 is coupled to an input terminal of a two-stage divider 21 which, in turn, has its binary outputs 34 and 35 coupled to a one-of-four output decoder circuit 22. The outputs of the one-of-four decoder circuit 22 which are 36, 37, 38 and 39 are coupled to each one of the horizontal lines of the matrix array while the output of the one-of-eight decoder circuit 20 is coupled to an associated one of a plurality of NAND gates 23, 24, 25, 26, 27, 28 and 29 associated with the seven vertical lines of the matrix array. It will be understood that the dividers 19 and 21 together with the decoders 20 and 22 can be replaced with an eight-bit and a four-bit shift register.

Figure 2:
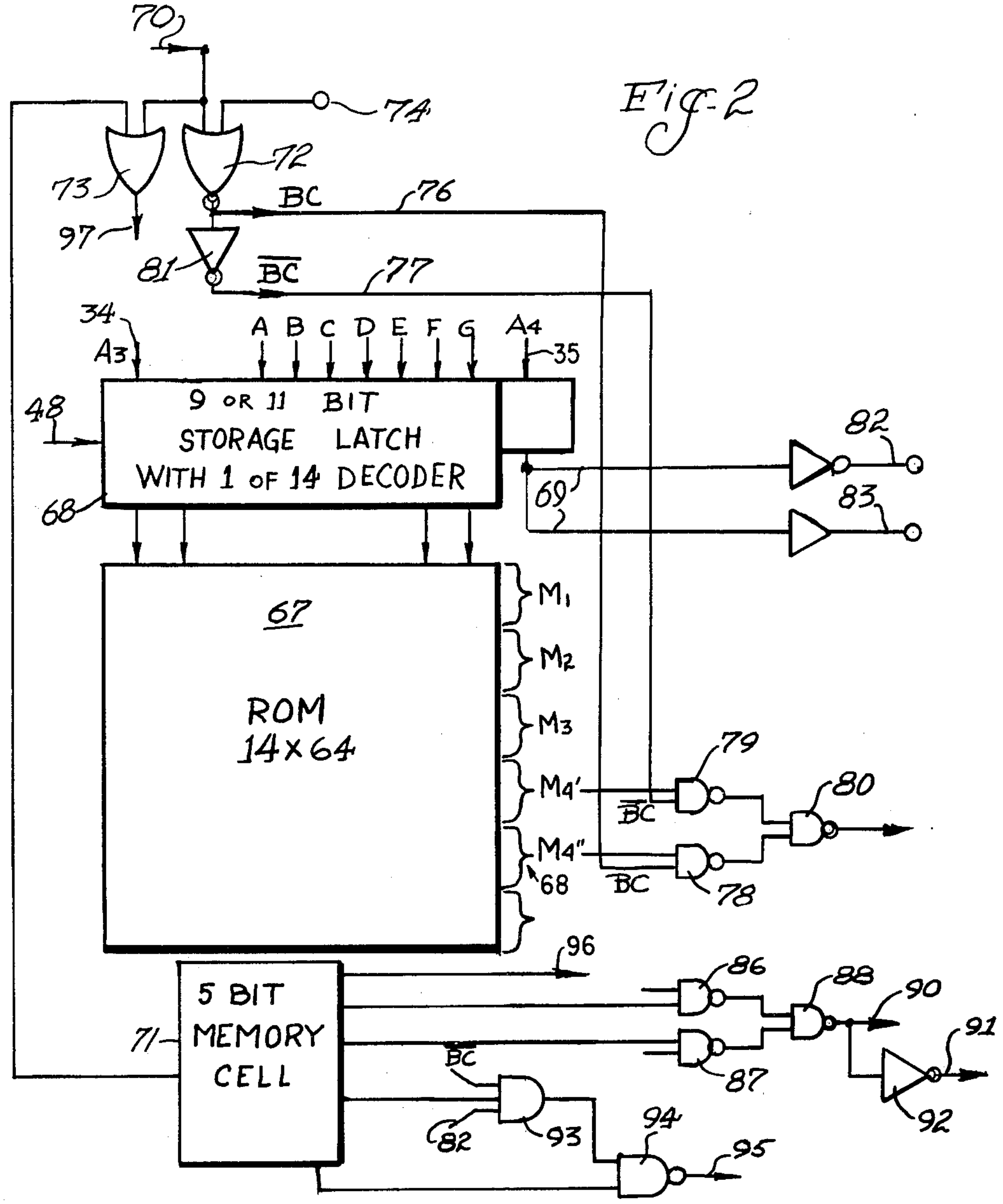
FIG. 2 illustrates still another portion of the logic circuit utilized in accordance with the principles of this invention.

The one-of-four decoder 22 applies a logic one state to each of the lines sequentially while the one-of-eight decoder 20 applies an enable signal also sequentially to the associated one of a plurality of NAND gates 23, 24, 25, 26, 27, 28 and 29. Thus, this 32 count counter system sequentially looks for closed switches starting with line 36 being high and then looking at the plurality of NAND gates one at a time. Therefore, when one of the switches 13 is closed to have the horizontal associated line coupled to the vertical line, a pulse signal will pass through the NAND gate associated therewith. The outputs of the NAND gates 23, 24, 25, 26, 27, 28 and 29 are delivered to a multi-input NAND gate 30 which, in turn, has its output coupled to line 41. This line 41 goes high whenever a switch closure in encountered at the proper switch count position of the scan counter formed between one-of-four decoder 22 and one-of-eight decoder 20. The output of NAND gate 30 is also coupled to the input of a 32 bit shift register 42, the reset line of two-bit shift register 43, AND gates 44 and 59 an INVERTER 45, and two internally programmed switches 46 and 47. These two intervally programmed switches are connected as shown for the chord button system in what is called the "lockout" mode or system. Whenever a closed switch is encountered, a high signal on line 41 passes through switch 46 and INVERTER 18 and then to AND gate 16. This signal will turn off the scan clock input and the scan counter system. These signals will remain in this state until the chord button switch 13 is released, thus the signal on line 41 and line 17 will reverse and the clock will again start scanning until a new switch closure is encountered. This same switch closure signal also passes through the internal switch 47 to line 48, which in FIG. 2 is the signal line for transferring and storing the closed chord switch count position. This same signal line 41 also goes to the reset input of a two-bit shift register 43. The output of this shift register 43 goes on input of NOR gate 49. The other input of NOR gate 49 is the input terminal 51 which is the encode inhibit input. When the encode inhibit input 51 is low and NOR gate 49 is enabled when a chord switch closure is encountered, a signal on line 41 will reset the output of 43 to a low and the output of NOR gate 49, which is output terminal 50, goes high. This output terminal 50 is the D.C. gate output signal denoting that a switch is closed and thus turning "on" the proper audio frequencies from within the chip. Upon the release of the chord button switch it will take two clock input pulses on line 53 to this shift register 43 to return its output to a high level, thus, turning "off" terminal 50. Clock line 53 is the output of AND gate 52 whose inputs are H and 39 from the switch scanning decoders above, thus, resulting in an output at scan count 32 (end of a complete scan cycle). Therefore, the scanning system must scan at least one complete cycle without encountering a switch closure before output 50 will turn "off".

If the two internally programmed switches 46 and 47 are in the opposite position of that shown, we have a "priority system" which is used for the pedal and synthesizer or manual keyboards. Switch closure signal line 41 also passes through INVERTER 45 to signal line 54. Line 54 is one input to AND gate 55 whose output is the clock input to shift register 56. Scan count 32, line 53 is the "set" input to this shift register setting the output lines 57 and 58 to a high level. Thus, when the first switch closure of the scan is encountered, the signal line 41 to AND gate 44 will result in a high signal on the AND gate output to switch 47 and, thus, line 48 for transfering the switch count position. Because the scan does not stop on the closed switch, at the next scan count, signal line 41 returns to a low level and signal 54 to a high level resulting in a clock pulse to shift register 56 through AND gate 55. This clock pulse will shift a low level to output lines 57 and 58, thus deactivating AND gates 44 and 55. Thus, any other switch closures of this same scan cycle will not be entered into this system until the set pulse at count 32 reactivates the system for the first entry of the next scan. Thus, the first switch position at the cross over of line 36 and NAND gate 23 will be the lowest note on the pedal for "low note priority" and it will be the highest note on a manual keyborad for "high note priority".

Switch closure signal line 41 also goes to the input of a 32 bit shaft register 42 and one input of AND gate 59. This shift register has the same clock input as the scanning counter and decoders so each bit of the shift register coincides with one position of the 32 count scan counter. When the first switch closure is encountered the output line 61 of shift register 42 is at a low level then AND gate 59 turns "on" while a high level is entered on the input of shift register 42. The output of AND gate 59 denotes a "new switch closure" and is the start input line to nine-bit counter decoder system 62. This block 62 allows the clock input to the counter and turns on an output line 65. This output remains high until count 400 of the 512 count counter at which time the output goes low. At count 512 the counter stops and remains off until a new start signal is received. The start signal starts the counter only if it is setting at count 512, so once the counter is operating a new start signal will not do anything unless it occurs after the 512 counts. This 400 count at 50 KHz resulting in an 8 ms. pulse output signal at terminal 64 is used as a control for keying percussive type voices from the keyboard. [banjo, wah-wah trumpet, bass drum, etc.]. As the scanning of this system continues, on the next time around to the same switch closure, signal line 41 to shift register 42 and AND gate 59 is high again except the other input to AND gate 59 is low, however, because the output line 61 of the shift register is high. The shift register 42 is high because the switch closure was entered at the last scan of this switch position and the shift register "remembers" that the switch was closed before, thus, no pulse output on line 65. If a second switch closure is encountered, the AND gate 59 and, thus, output pulse at terminal 64 will again occur, even if this new switch is not entered on line 48 because of lower priority. As the scanning continues, and the key switch is released then at this key switch position there will be no signal on line 41, however, output line 61 of the shift register is high because this switch was still closed on the last scan. AND gate 63 will turn on the one-shot 64 because line 61 is high (switch closed on last scan) and line 54 (switch not closed on present scan) is high. The one-shot pulse width is controlled with the R—C values of the external resistor 66a and capacitor 66. This one-shot output passes trough internally programmed switch 46, through INVERTER 18 to AND gate 16 to stop the scan. This procedure is to insure against false pulse output signals due to contact bounce. This one shot and scan stop will occur for the total delay of the one-shot of about 1 or 2 ms. If at any time, because of contact bounce, line 41 goes high and thus line 54 and AND gate 63 go low then the one-shot will immediately turn off and the scanning will again begin, but the switch closure will still be retained in the shift register. Thus, if the switch is open again then on the next scan the same one-shot signal with the scan stop will occur with the same delay as long as the switch closure is open for the entire delay. This one-shot delay can also occur on key closure if contact bounce is still present on the second scan of this switch closure. However, here the delay will be long enough to insure the key closure remains entered. It should be noted this system has a time delay built into our key switch release before releasing the memory, but the system can be changed so the output of AND gate 59 drives the one-shot and the delay occurs on key closure instead of key release. The only other change would be that the start input to 62 would occur only at end of the complete time delay cycle of the one-shot which thus insures accepting a key closure.

Referring now to FIG. 2 the remainder of the logic circuit, which may be constructed on the same large scale integrated circuit chip, is illustrated. Here the output pulse signal from line 48 is applied to the input of a storage latch decoder circuit 68. This decoder circuit has a plurality of input lines corresponding to the output lines A—G of the eight output decoder 20, FIG. 1. Also associataed with the storage latch decoder circuit 68 are a pair of input lines 34 and 35 which correspond to the two-stage divider 21 of FIG. 1. The output of the storage latch decoder is delivered to a read-only-memory matrix 67 which has a plurality of groups of outputs designated generally by $M_1$, $M_2$, $M_3$, $M_4'$ and $M_4''$, and C. The read-only-memory may be formed of two memories, each having fourteen columns, thus providing a capacity for twenty-eight switches. However, when a twenty-one or a twenty-eight switch chord arrangement is used, only fourteen of the read-only columns are used with the sevenths added for the other seven or fourteen. Each of the M outputs provides a group of signal lines to be delivered to selected ones of a corresponding plurality of programmable divisor circuits to be described in more detail hereihbelow. The output of the NOR gate 49, an output terminal 50, FIG. 1, is coupled to a line 70 to indicate that a key is closed. This D.C. control signal is delivered to a NOR gate 72 and to an OR gate 73. The NOR gate 72 as a second input which provides automatic bass signal information at a terminal 74 to produce a first output signal across a line 76 and a second output signal, which is inverted from the first, over a line 77. These two output signals are delivered to selected ones of the inputs of a group of twelve pairs of NAND gates 78 and 79, respectively. NAND gates 78 and 79 have their outputs coupled to the input of a second NAND gate 80. Therefore, these twelve ouputs will produe either the $M_4'$ or the entire $M_4''$ output group by enabling either of the NAND gates 78 or 79 in response to the output of the NOR gate 72 or the inverter amplifier 81 connected in series therewith. For the chord switches, the information stored in the storage latch circuit 68 will remain until a subsequent signal on line 48 is received.

It will be noted that the outputs of lines 69 are delivered to a pair of operational amplifiers 82 and 83 which, in turn, are connected to appropriate terminals for application to various electronic components associated therewith, as for example, in the ORBIT synthesizer system it is desirable to know which octave is being keyed in order to select the proper filters for the flute voice frequency outputs. Besides the read-only-memory circuit 67 there is also five-bit memory cell 71 for controlling some of the chip functions. Two control outputs go into a pair of NAND gates 86 and 87 which, in turn, are tied together at a pair of inputs of NAND gate 88. The second input to NAND gate 86 is the output line from INVERTER 82 above and the second input to NAND gate 87 is from the latch output line 69. The output of NAND gate 88 is applied to a first terminal 90 while the output is also applied to a second terminal 91 through an inverter amplifier 92 which produces the same D.C. control but opposite in polarity. The use of these signals is to drive the output circuit associated with each of the programmable divisors, as set forth more clearly in FIG. 3 hereinbelow. Output 90 can be internally programmed to be always high, always low, high for first fourteen switches only, or high for second fourteen switches only. Also associated with this memory cell 71 is a three input AND gate 93 whose other two inputs are line 77 (BC) and output line of INVERTER 82. The output of this gate is the input of NAND gate 94 with the other input also being from the memory cell 71. The final output line 95 is a control line that can be programmed to always be high, always be low, or to be high only on the second fourteen switches but only if control line 77 is such that $M_4'$ instead of the $M_4''$ control is tied to the last programmable divisor. Another line from this memory cell 71 goes to OR gate 73 to control output line 97. Output line 97 thus will either always be high or it will be high only during key closure. The memory cell also has an output line 96 which will be associated with the circuitry of FIG. 4.

Figure 3:
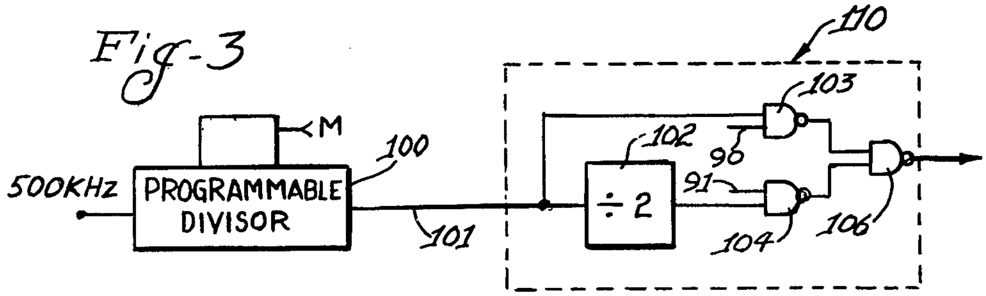
FIG. 3 illustrates a single one of the programmable divisor circuits utilized in accordance with the principles of this invention and further illustrates a divide-by-two circuit arrangement wherein a sub-harmonic may be desired to develop the appropriate tone signal.
Figure 4:
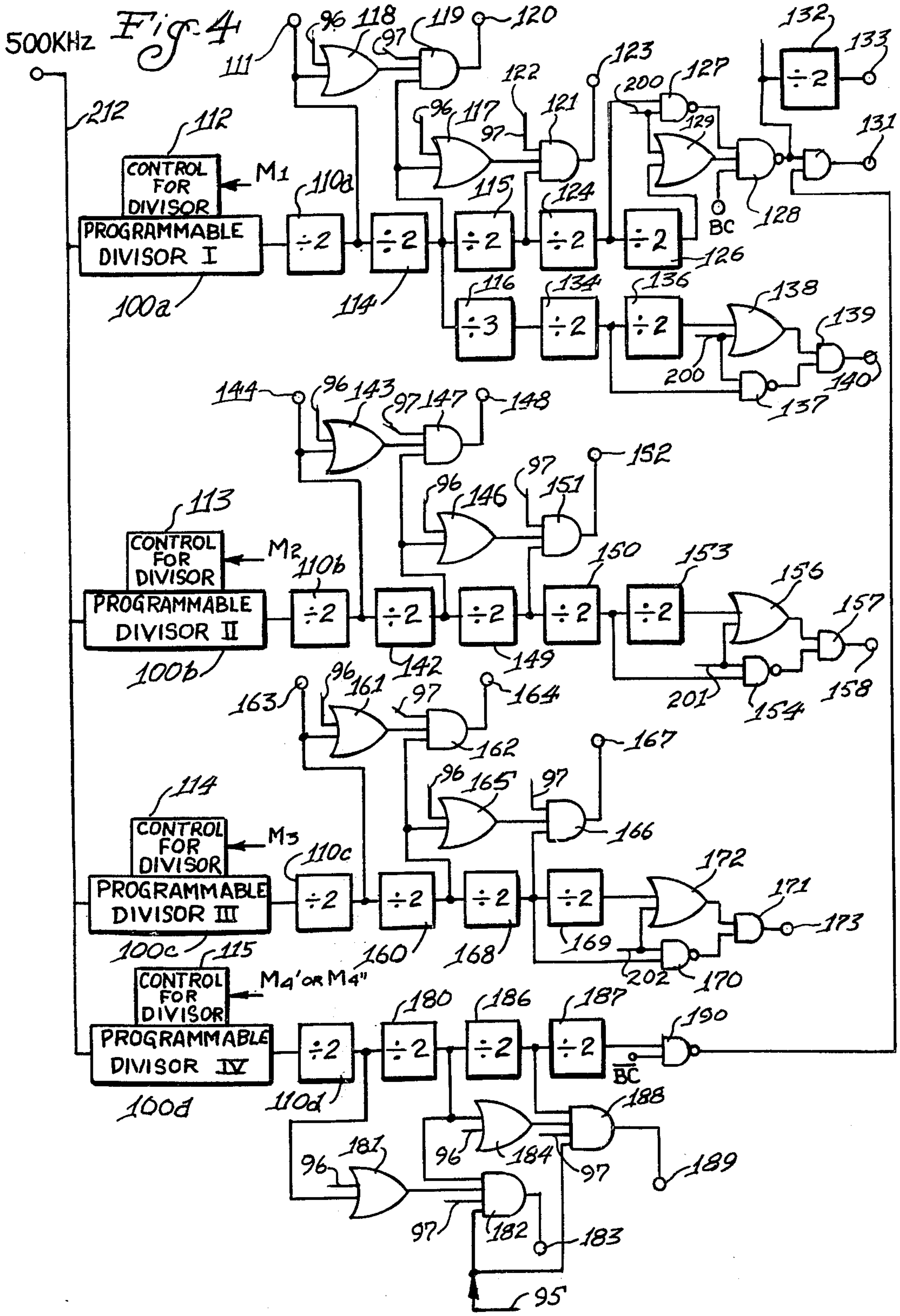
FIG. 4 illustrates a plurality of programmable divisor circuits operated from a single input frequency and having their outputs connected to a plurality of groups of dividers which, in turn, develop the appropriate tone signal information.

For a better understanding of the M outputs of the read-only-memory, reference is now made to FIG. 3 which illustrates one of the programmable divisor circuits associated with the circuit of FIG. 4. The programmable divisor circuit may be formed by a plurality of shift registers and gates. The programmable divisor circuit is capable of changing the divisor from 100 to over 1,000 in order to obtain any preset audio frequency range of 500 Hz to 5 KHz using the 500 KHz input. Changing the input frequency will also change this range. However, to obtain more accurate frequency outputs, the divisor is maintained between 200 and 1,000. The M input is to be understood as containing a plurality of input lines which will obtain the appropriate interrogating code to activate the programmable divisor here illustrated by reference numeral 100. The output of the programmable divisor is then delivered over a line 101 to the input of a divide-by-two flip-flop circuit 102 and to one input of a NAND gate 103. The output of the divide-by-two flip-flop circuit 102 is delivered to a NAND gate 104. The outputs of each of the NAND gates 103 and 104 are delivered to a second NAND gate 106. The NAND gate 103 or 104 which is enabled by application of an enabling signal will determine whether or not the output of the programmable divisor is divided by one or divided by two. This is determined by connecting the output lines 90 and 91 to the inputs of the NAND gates 103 and 104. If NAND gate 103 is enabled, the output of NAND gate 106 will be a divide-by-one output, while on the other hand, if NAND gate 104 is enabled, the output will be a divide-by-two. For the chord LSI, the extra divide-by-two is never used, for the pedal, the extra divide-by-two occurs on the closure of the first of the switches 13 only, and on the keyboard (synthesizer, etc.) the extra divide-by-two occurs on the closure of the second 14 of switches 13. The divide-by-one or divide-by-two circuit is designated generally by reference numeral 110 and is associated with each of the programmable divisors to be discussed with regard to FIG. 4.

Referring now to FIG. 4 there is seen a logic circuit diagram which forms part of the present invention, and which may be constructed together with the rest of the components illustrated herein on a single larged scale integrated circuit chip. Here an input line 212 receives a clock frequency which may vary between 0.2 to 2.5 megahertz. When the circuit as shown is used to produce chords and pedal notes, the input clock frequency will be 500 KHz. However, when using the principle of this circuit arrangement as a synthesizer, the input clock frequency will be 1.5 MHz. This input clock frequency is applied to an input terminal of each of a plurality of programmable divisor circuits 100*a*, 100*b*, 100*c* and 100*d* as described with regard to FIG. 3. The M inputs from the read-only-memory are connected to the control for the divisors designated generally by reference numerals 112, 113, 114 and 115. In accordance with the present invention, each of the programmable divisors is adapted to be changed so that the divisible factor associated therewith can be selected to produce any desired frequency type of output signal information. At present the programmable divisors are of the type which are set individually at the place of manufacture at the request of a potential purchaser by the program preset into the read-only-memory 67. However, it will be understood that the programmable divisors may include input memory means so that their particular divisor factor at any given time can be altered selectively. The ouput of each of the programmable divisors is delivered to a divide-by-one or divide-by-two circuit, as set forth in FIG. 3, 110*a*, 110*b*, 110*c* and 110*d*.

The output of the divide-by-one or divide-by-two network 110a is delivered to an output terminal 111 and to the input of a first divide-by-two flip-flop circuit 114 which, in turn, has its output delivered to a divide-by-two flip-flop circuit 115 and a divide-by-three flip-flop circuit 116 and to a input of an OR gate 117. This then starts the generation of a plurality of completely distinct output signals but which are to be considered as many octaves of the fundamental frequencies. For example, the output of the divide-by-one or divide-by-two network 110*a* is delivered to one input of an OR gate 118 which, in turn, has its output delivered to an AND gate 119. However, the output of divide-by-two circuit 114 is also delivered to AND gate 119 and produces a first sub-harmonic output signal at a terminal 120. This signal includes both a high octave fundamental and a second harmonic frequency. The output of flip-flop 114 is also delivered through OR gate 117 to an AND gate 121 which, in turn, has another input thereof connected to the output of flip-flop circuit 115. A gate control circuit line 97 is applied to a terminal 122 thereby providing a second output signal at terminal 123. This signal also incorporates a mid-octave fundamental frequency and a second harmonic, but this being one octave displaced from the signal developed at terminal 120. If the control line 96 from FIG. 2 is 0 (as in the chord chip) then the outputs at terminals 120 and 123 are one quarter duty cycle outputs, because the fundamental and second harmonic are gated together. This has a more desirable harmonic structure for voicing the two octaves of chords that are generated. For the pedal and the synthesizer line 96 is high so only the square wave of each fundamental appears on these AND gate outputs. For all three systems control 97 is always high so all frequency outputs (terminals 120 and 123, etc.) remain "on" even after the key or chord switch is released.

The output of flip-flop circuit 115 is delivered to a divide-by-two flip-flop circuit 124 which, in turn, has its output delivered to a second flip-flop circuit 126 and to the input of a NAND gate 127. The NAND gate 127 has a second input connected from control line 200 which is one of the 4 C control lines of the read-only-memory 67 of FIG. 2, thereby gating therethrough the flip-flop signal to a NAND gate 128. The output of flip-flop circuit 126 is delivered through an OR gate 129 which, in turn, has its output also connected to the NAND gate 128. Control line 200 which is also an input to OR gate 129 determines whether the output of NAND gate 128 is from flip-flop 124 or from flip-flop 126. Thus, control line 200 controls whether NAND gate 128 is one octave or two octaves below the chord frequency at terminal 123. This is used to obtain "chord inversion" on the chord chip where individual chord frequencies but not bass frequencies will revert up or down to remain in a one octave range. The output of NAND gate 128 is connected to both and AND gate 130, which has its output connected to a terminal 131, and also to the input of a divide-by-two flip-fop circuit 132. This flip-flop circuit 132 is connected to an output terminal 133 to produce a frequency signal which is an octave below that developed at terminal 128.

Referring back now to flip-flop circuit 114, the output thereof is delivered to a series of flip-flop circuits beginning with a divide-by-three circuit 116 and continuing through a pair of flip-flop circuits 134 and 136. The output of flip-flop circuit 134 is delivered to the input of a NAND gate 137 while the output of flip-flop circuit 136 is delivered to an OR gate 138. The outputs of NAND gate 137 and OR gate 138 are brought together at AND gate 139 to combine signals and develop an audio signal at output terminal 140. The same control line 200 is the second input to NAND gate 137 and OR gate 138. The particular frequency developed at the various output terminals is readily changeable by predetermined selection of the particular divisor factor obtained by the programmable divider 100*a*.

Referring now to the output of divide-by-one and divide-by-two network 110*b*, it is connected to a flip-flop divide-by-two circuit 142 and to the input of an OR gate 143. However, also connected to the output of this network is an output terminal 144 which provides a first signal output to be utilized. The output of flip-flop 142 is connected to an OR gate 146 and to an AND gate 147 which, in turn, produces an output signal at terminal 148 which is reduced from that delivered in terminal 144 by one octave. Flip-flop 142 is connected to the input of a second flip-flop 149 which, in turn, has its output connected to a flip-flop circuit 150 and to one of the inputs of an AND gate 151. The output of AND gate 151 is connected to an output terminal 152 which, in turn, delivers a frequency which is one harmonic below that delivered to output terminal 148. Flip-flop circuit 150 is then coupled both to a flip-flop circuit 153 and to a NAND gate 154. The output of flip-flop 153 is delivered through OR gate 156 and is connected to an AND gate 157 together with the output NAND gate 154. The output signal developed at terminal 158 is one or two octaves below that developed at terminal 152 depending on the input control line 201 from the C output lines of the read-only-memory 67. The other control inputs are the same lines 96 and 97 from above.

The output of the divide-by-one or divide-by-two network 110*c* is delivered to a divide-by-two flip-flop 160 and to the input of an OR gate 161 which, in turn, has its output delivered to an AND gate 162. The output of the divide-by-one or divide-by-two network 110*c* is also delivered to an output terminal 163 while the output of flip-flop circuit 160 is delivered to an output terminal 164 through AND gate 162 and is one octave lower in frequency than that delivered to terminal 163. The output of flip-flop 160 is also delivered to OR gate 164 which, in turn, has its output delivered to AND gate 166 which has its output connected to terminal 167. Flip-flop 160 is also connected to flip-flop divide-by-two circuit 168 which, in turn, has its output connected to a flip-flop 169 and to one of the inputs of AND gate 166. The output of flip-flop 168 is also delivered to NAND gate 170. The output of NAND gate 170 is combined to an AND gate 171 with an output of flip-flop 169 which passes through OR gate 172. This then develops a signal at terminal 173 which is either one octave below or the same frequency as that of the signal developed at terminal 167 depending on whether the control input line 202 from the read-only-memory 167 is low or high. Control lines 200, 201 and 202 are individually programmed in the read-only-memory for each chord button switch position.

The output of divide-by-two circuit 110d is delivered to a flip-flop divider 180 and to an OR gate 181 which, in turn, has its output connected to one of the inputs of an AND gate 182. The output of AND gate 182 is delivered to a terminal 183 which produces the desired output signal. The output of flip-flop circuit 180 is also delivered to an OR gate 184 and to a flip-flop circuit 186 which, in turn, has its output delivered to a flip-flop circuit 187. The output of flip-flop circuit 186 is also delivered to an AND gate 188 which produces a signal at terminal 189. Flip-flop circuit 187 is delivered to AND gate 190 which has its output coupled back to one of the inputs of AND gate 130. The control line inputs 96 and 97 to the OR and AND gates have a similar function as above, however, there is an extra input control line 95 to the two AND gates. This allows that the outputs on terminals 183 and 189 be allowed only when the $M_4'$ divisor control (BC is high) is acting on the programmable divisor and also one of the seventh's chord switches has been closed last. Any time the BC control goes low then the programmable divisor reverts to the $M_4''$ control input, and output terminal 131 reverts from NAND gate 128 to NAND gate 190, thus, changing what is normally programmed as the bass root frequency from programmable divisor I to the bass second frequency derived from the $M_6''$ controlled programmable divisor IV. This is used from the auto-bass (bass riff) on the chord button or pedal keyboard system.

Therefore, a single frequency input line 112, when delivered to four programmable divider circuits 110*a*, 100*b*, 100*c* and 100*d* can produce a multitude of different frequency output signals at the various terminals located on the logic circuit of FIG. 4. The input line 112 is also connected to a divide-by-ten circuit 40 which produces the 50 KHz scanning pulses as shown in FIG. 1. This circuit may be a divide-by-thirty when the input clock is 1.5 MHz.

In this case all four programmable divisors are programmed by any one individual key switch of up to twenty-eight (or more with more inputs and larger counter systems) key switches. If it is desirable to play up to four key switches simultaneously then this can be done with a separate decoder/latch 68 and ready-only memory 67 for each of the four (or more) programmable divisors. Signals developed by gates 86, 87, 88 and 92 must be duplicated for each of the four latch output control lines 69 and 82. Also these four latches would have to have four signal transfer lines 48. This can be obtained by using a four-bit shift register for block 56 in FIG. 1 along with four AND gates 44. The line 58 input to each AND gate will be separate lines, one from each of the shift register outputs. If the count 32 reset signal puts a 1 in the first shift register and O's in the others (and remove AND gate 55 and connect line 54 as the CL input to 56), the first key switch is each scan will control programmable divisor I from shift register bit 1 through gate 44A, the second key switch closure in each scan will control program divisor II through shift register bit 2 and gate 44B, etc., for up to four key switches at a time. This can, therefore, be used for a low cost single chip organ keyboard for up to 25, 37 or 44 keys by expanding on the key switch counter decoder and matrix system and more key switches simultaneously by adding more latches and read-only-memories.

While a single specific embodiment of the invention is disclosed herein, it will be understood that a multitude of variations and modifications may be effected without departing from the spirit and scope thereof as set forth in the specification and claims disclosed herein.

The invention is claimed as follows:

1. A tone signal generator for electronic musical instruments comprising a plurality of programmable divisor circuits each capable of dividing a given frequency input signal by a plurality of different divisors to produce a base frequency signal and a plurality of sub-harmonics thereof, input circuit means for applying a given frequency signal to each of said programmable divisor circuits, output circuits means for receiving selected one of a said plurality of different frequency signals produced by said programmable divisor circuits and control circuit means connected to said programmable divisor circuit including selector means selectively to maintain and change the divisor factors of said programmable divisor circuits.

2. The tone signal generator for electronic musical instruments as set forth in claim 1, wherein said selector means includes selector switch means manually operable to selectively effect the change of the said divisor factors of said programmable divisor circuits.

3. The tone signal generator for electronic musical instruments of claim 2 wherein said switch means comprises a plurality of switches.

4. The tone signal generator for electronic musical instruments of claim 3 wherein said selector means further includes means selectively to change said divisor factors in response to activation of selected ones of said plurality of switches and to continuously maintain said divisor factors even after said selected ones of said plurality of switches are released.

5. The tone signals generator for electronic musical instrments of claim 4 wherein said selector means further include means operable upon activation of subsequent ones of said plurality of switches for causing said programmable divisor circuits to discontinue maintaining said divisor factors and to change said divisor factors in response to said activation of said subsequent ones of plurality of switches.

6. The tone signal generator for electronic musical instruments of claim 3 wherein said selector means further includes means selectively to change said divisor factors in response to selected ones of said plurality of switches and to continuously maintain said divisor factors only until said selected ones of said plurality of switches are released.

* * * * *